(12) United States Patent
Oh et al.

(10) Patent No.: US 9,604,314 B2
(45) Date of Patent: Mar. 28, 2017

(54) METHOD FOR FORMING A MASK PATTERN USING A LASER

(71) Applicant: Samsung Display Co., Ltd., Yongin, Gyeonggi-Do (KR)

(72) Inventors: Yoon-Chan Oh, Yongin-si (KR); Choong-Ho Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 476 days.

(21) Appl. No.: 14/291,833

(22) Filed: May 30, 2014

(65) Prior Publication Data

US 2015/0014888 A1 Jan. 15, 2015

(30) Foreign Application Priority Data

Jul. 9, 2013 (KR) ........................ 10-2013-0080547

(51) Int. Cl.
*B23K 26/38* (2014.01)
*G03F 7/12* (2006.01)
*B23K 26/362* (2014.01)
*B23K 37/04* (2006.01)
*B23K 26/10* (2006.01)
*H01L 51/56* (2006.01)
*G03F 7/20* (2006.01)

(52) U.S. Cl.
CPC ............ *B23K 26/38* (2013.01); *B23K 26/10* (2013.01); *B23K 26/362* (2013.01); *B23K 37/0408* (2013.01); *G03F 7/12* (2013.01); *G03F 7/70733* (2013.01); *G03F 7/70783* (2013.01); *H01L 51/56* (2013.01)

(58) Field of Classification Search
CPC .................................. B23K 26/38; G03F 7/12
See application file for complete search history.

(56) References Cited

U.S. PATENT DOCUMENTS

| 6,615,099 B1 * | 9/2003 | Muller | B23K 26/04 219/121.68 |
| 6,858,086 B2 * | 2/2005 | Kang | C23C 14/042 118/504 |
| 8,938,317 B2 * | 1/2015 | Goldsmith | B23K 26/38 700/166 |
| 2013/0178972 A1 * | 7/2013 | Goldsmith | B23K 26/38 700/166 |

FOREIGN PATENT DOCUMENTS

| KR | 10-0647576 B1 | 11/2004 |
| KR | 10-0791338 B1 | 1/2008 |
| KR | 10-1182439 B1 | 9/2012 |

* cited by examiner

*Primary Examiner* — Benjamin Schiffman
(74) *Attorney, Agent, or Firm* — Cantor Colburn LLP

(57) ABSTRACT

A method of forming a pattern on a mask sheet using a laser beam includes determining a target scan line with respect to the mask sheet, which corresponds to a position of the pattern on a final mask sheet, determining a correction scan line with respect to the mask sheet, along which the laser beam is scanned to form the pattern of the final mask sheet, applying a counter force to the mask sheet, fixing the mask sheet onto a mask frame while the counter force is applied to the mask sheet, scanning the laser beam along the correction scan line, and releasing the counter force which is applied to the mask sheet.

5 Claims, 7 Drawing Sheets

METHOD FOR FORMING A MASK PATTERN USING A LASER

This application claims priority to Korean Patent Application No. 10-2013-0080547 filed on Jul. 9, 2013, and all the benefits accruing therefrom under 35 U.S.C. §119, the entire contents of which are incorporated herein by reference.

BACKGROUND (1) Field

The invention relates to a method for forming a mask pattern, and more particularly, to a method of forming a pattern on a mask sheet using a laser beam.

(2) Description of the Related Art

In order to manufacture a fine metal mask (hereinafter, referred to as a "mask sheet") which is used for an organic light emitting diode ("OLED") display, a chemical wet etching method is used. In this case, a stretching process which applies a counter force and a welding process are applied to the mask sheet which is manufactured by the wet etching method, and then the mask sheet is loaded on a mask frame. When the mask sheet is loaded on the mask frame, a method that stretches the mask sheet and welds the mask sheet to the mask frame is used in order to effectively prevent the mask sheet from being moved. In order to secure a final pattern position, the counter force needs to be applied.

However, the above-mentioned mask manufacturing method has a limitation in a manufacturing quality using the wet etching method due to a nano-sized pattern shape of the mask sheet due to a high resolution, e.g., 400 pixels per inch (ppi) or higher resolution, of the OLED display. Therefore, a mask manufacturing method that processes a pattern using a laser processing has been developed.

In the mask manufacturing process using a laser, instead of using a wet etching method, a mask sheet is manufactured using a laser beam. However, in order to fix the mask sheet to the mask frame, the same process which applies a counter force to the mask sheet and uses the complex stretching and welding process is used.

SUMMARY

In a mask manufacturing process using a laser, a mask sheet is stretched in the mask frame, and then a local area is processed with a laser beam to form a pattern. However, a final pattern formation position may be shifted from an initially estimated position, which may cause a pattern error during a deposition process. Therefore, there remains a need for an improved method of forming a mask pattern in which an initial position of the mask sheet is maintained.

The invention has been made in an effort to provide a method of forming a pattern which may effectively prevent a pattern error from occurring when a pattern is formed on a mask sheet using a laser beam during a mask manufacturing process.

An exemplary embodiment provides a method of forming a pattern on a mask sheet using a laser beam, including determining a target scan line with respect to the mask sheet, which corresponds to a position of the pattern on a final mask sheet, determining a correction scan line with respect to the mask sheet, along which the laser beam is scanned to form the pattern of the final mask sheet, applying a counter force to the mask sheet, fixing the mask sheet onto a mask frame while the counter force is applied to the mask sheet, scanning the laser beam along the correction scan line, and releasing the counter force which is applied to the mask sheet.

In an exemplary embodiment, the determining the correction scan line of the laser beam may include applying a counter force to a preparatory mask sheet, fixing the preparatory mask sheet to a preparatory mask frame while the counter force is applied to the preparatory mask sheet, scanning the laser beam along the target scan line, releasing the counter force which is applied to the preparatory mask sheet, determining an actual scan line of the laser, in a status when the counter force which is applied to the preparatory mask sheet is released, determining an error of the target scan line and an actual scan line of the laser beam, and setting the correction scan line of the laser beam using the checked error.

In an exemplary embodiment, in the setting of a correction scan line of a laser beam, the correction scan line may be substantially symmetrical to the actual scan line with reference to the target scan line where a distance between the target scan line and the actual scan line, and between the target line and the correction scan line, is substantially the same.

In an exemplary embodiment, in the setting the correction scan line of the laser beam, an angle between the target scan line and the correction scan line may be substantially same as an angle between the target scan line and the actual scan line.

According to the exemplary embodiment, the laser beam is scanned along the correction scan line of the laser beam for forming a pattern along a target scan line through which a pattern of the mask sheet needs to be formed in a status when the mask sheet is completely manufactured, so that the pattern error is effectively prevented from occurring on the mask sheet.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
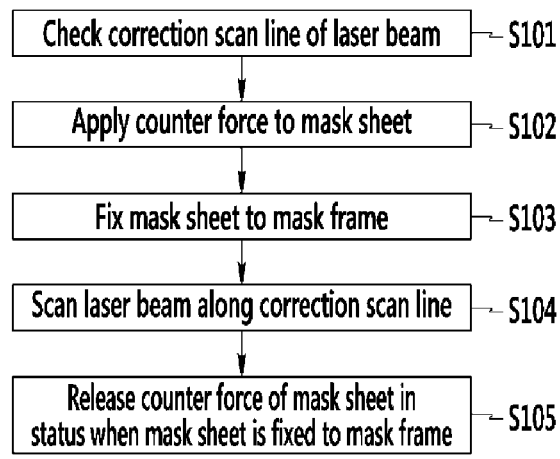
FIG. 1 is a flowchart of an exemplary embodiment of a mask pattern forming method using a laser beam according to the invention.

Hereinafter, the invention will be described more fully hereinafter with reference to the accompanying drawings, in which exemplary embodiments of the invention are shown. As those skilled in the art would realize, the described embodiments may be modified in various different ways, all without departing from the spirit or scope of the invention. The drawings and description are to be regarded as illustrative in nature and not restrictive. Like reference numerals designate like elements throughout the specification.

Like reference numerals are used for like elements when the drawings are explained. In the accompanying drawings, a size of components is exaggerated for clarity. Terminologies such as first and second may be used to describe various constituent elements, but the constituent elements are not limited by such terminologies. The terminologies may be used only for discriminating one constituent element from other constituent elements. In an exemplary embodiment, without departing from a scope of the invention, the first constituent element may be named as the second constituent element and similarly, the second constituent element may also be named as the first constituent element, for example. A singular form may include a plural form when there is no clearly opposite meaning in the context.

In this specification, it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance. It will be understood that when an element such as a layer, film, region, or substrate is referred to as being "on" another element, it can be directly on the other element or intervening elements may also be present. To the contrary, it will be understood that when an element such as a layer, film, region, or substrate is referred to as being "below" another element, it can be directly under the other element or intervening elements may also be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
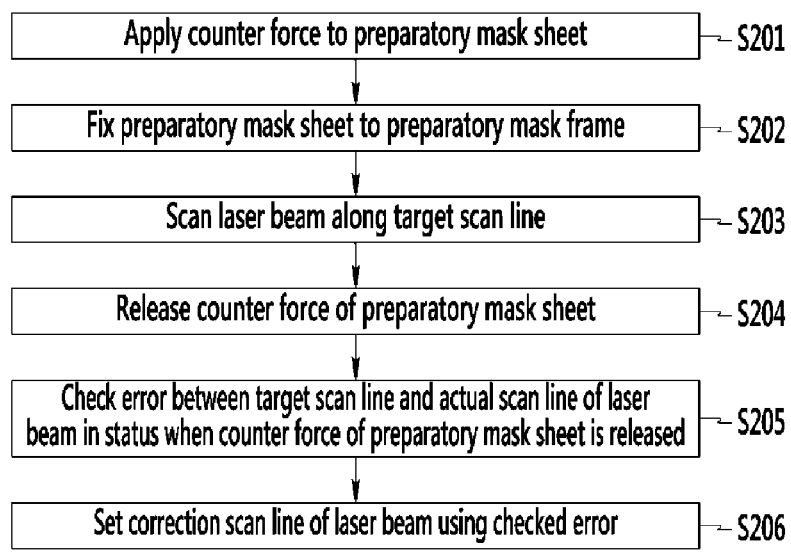
FIG. 2 is a flowchart of an operation of checking a correction scan line of a laser beam in the exemplary embodiment of the mask pattern forming method using a laser beam according to the invention.
Figure 3:
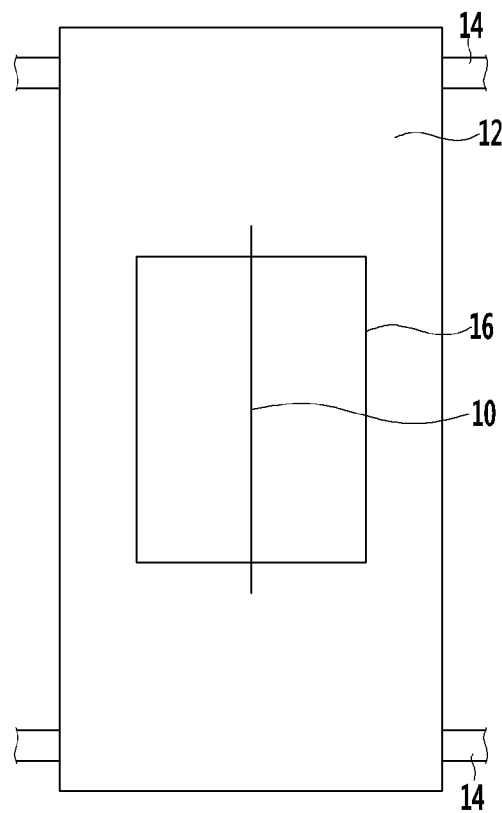
FIG. 3 is a diagram illustrating a target scan line on the mask sheet through which the laser necessarily passes.
Figure 4:
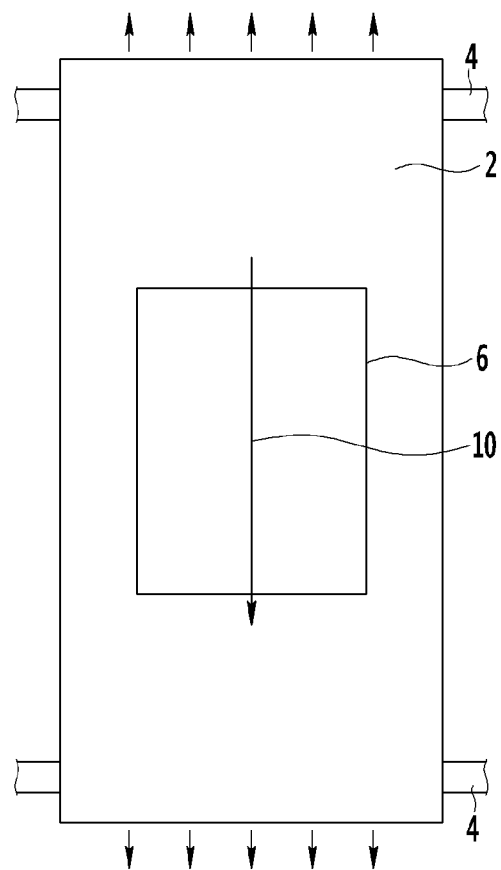
FIG. 4 is a diagram illustrating a status when the laser beam is scanned along the target scan line while a counter force is applied to a preparatory mask sheet.
Figure 5:
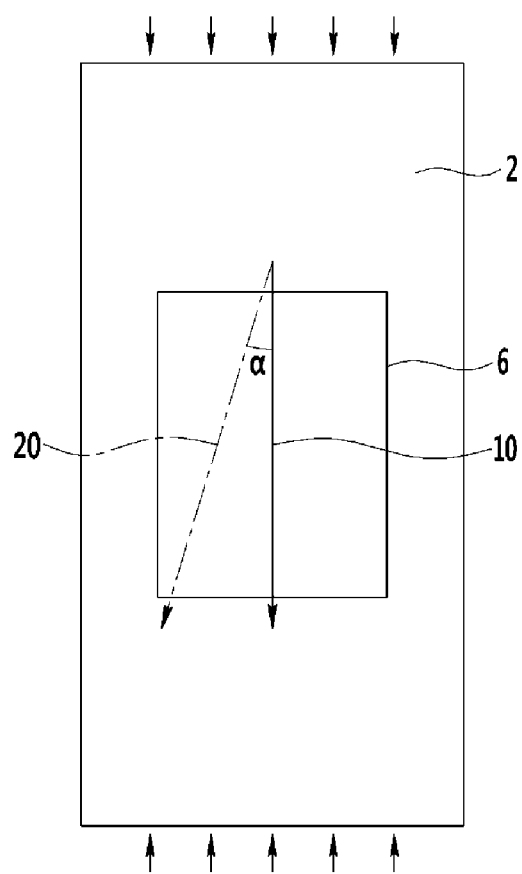
FIG. 5 is a diagram illustrating an actual scan line formed on the preparatory mask sheet in a status when the counter force is removed after scanning laser along the target scan line in a status when the counter force is applied to the preparatory mask sheet as illustrated in FIG. 4.
Figure 6:
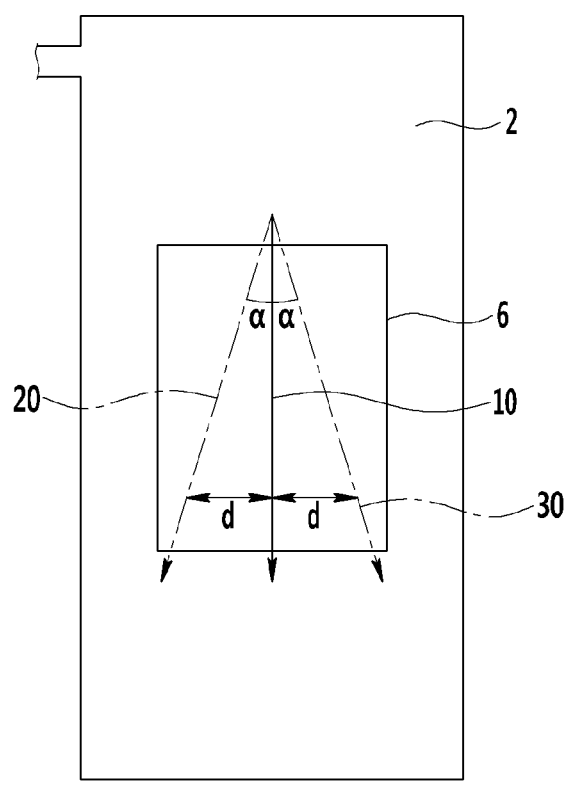
FIG. 6 is a diagram illustrating a status when the target scan line, an actual scan line, and a correction scan line are illustrated on the preparatory mask sheet.
Figure 7:
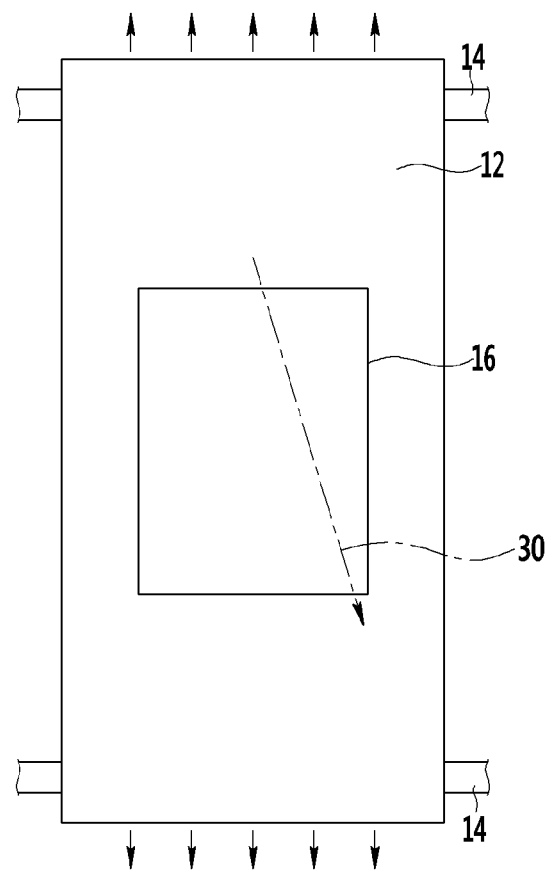
FIG. 7 is a diagram illustrating a status when the laser beam is scanned along the correction scan line while a counter force is applied to a mask sheet.
Figure 8:
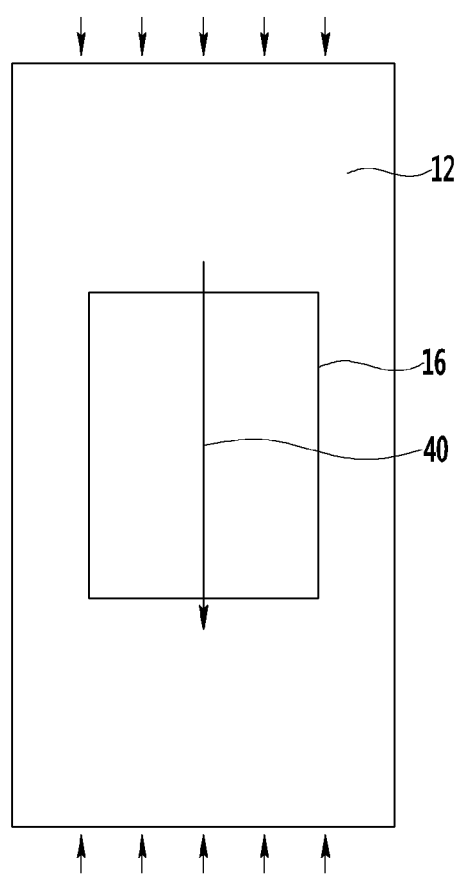
FIG. 8 is a diagram illustrating a final scan line formed on the mask sheet in a status when the counter force is removed after scanning laser beam along the correction scan line in a status when the counter force is applied to the mask sheet as illustrated in FIG. 7.

FIG. 1 is a flowchart of an exemplary embodiment of a mask pattern forming method using a laser beam according to the invention. FIG. 2 is a flowchart an operation of checking a correction scan line of a laser beam in the exemplary embodiment of the mask pattern forming method using a laser beam according to the invention. FIG. 3 is a diagram illustrating a target scan line on the mask sheet through which the laser necessarily passes. FIG. 4 is a diagram illustrating a status when the laser beam is scanned along the target scan line while a counter force is applied to a preparatory mask sheet. FIG. 5 is a diagram illustrating an actual scan line formed on the preparatory mask sheet in a status when the counter force is removed after scanning laser beam along the target scan line in a status when the counter force is applied to the preparatory mask sheet as illustrated in FIG. 4. FIG. 6 is a diagram illustrating a status when the target scan line, an actual scan line, and a correction scan line are illustrated on the preparatory mask sheet. FIG. 7 is a diagram illustrating a status when the laser beam is scanned along the correction scan line while a counter force is applied to a mask sheet. FIG. 8 is a diagram illustrating a final scan line formed on the mask sheet in a status when the counter force is removed after scanning laser beam along the correction scan line in a status when the counter force is applied to the mask sheet as illustrated in FIG. 7.

Referring to FIGS. 1 and 2, a method of forming a pattern on a mask sheet using a laser beam according to an exemplary embodiment may include an operation S101 of checking a correction scan line of the laser beam, an operation S102 of applying a counter force to the mask sheet, an operation S103 of fixing the mask sheet onto a mask frame, an operation S104 of scanning the laser beam along the correction scan line and an operation S105 of releasing the counter force which is applied to the stretched mask sheet in a status when the mask sheet is fixed onto the mask frame.

In this case, the operation S101 of checking the correction scan line of the laser beam may include an operation S201 of applying the counter force to a preparatory mask sheet, an operation S202 of fixing the preparatory mask sheet to a preparatory mask frame, an operation S203 of scanning the laser beam along the target scan line, an operation S204 of releasing the counter force which is applied to the preparatory mask sheet, an operation S205 of checking an error between the target scan line and an actual scan line of the laser beam in a status when the counter force which is applied to the preparatory mask sheet is released and an operation S206 of setting a correction scan line of the laser beam using the checked error.

More specifically, in the method of forming a pattern on a mask sheet using a laser beam according to the exemplary embodiment, after fixing a mask sheet 12 onto a mask frame 14 and before forming a pattern on the mask sheet using a laser beam, a correction scan line 30 (refer to FIG. 6) of the laser beam is checked in the operation S101.

In this case, the "correction scan line" refers to a corrected scan line through which the laser beam actually and necessarily passes in order to form the pattern along a pattern line (hereinafter, referred to as a "target scan line") which needs to be formed on the mask sheet in a status when the mask sheet is completely manufactured. FIG. 3 illustrates the target scan line 10 on the mask sheet 12 through which the laser beam necessarily passes.

In the illustrated exemplary embodiment, the target scan line 10 is represented as a straight line. However, in FIG. 4, in order to represent a direction in which the laser beam passes along the target scan line, an arrow is represented at an end of the target scan line 10. Further, in the illustrated exemplary embodiment, the laser beam performs scanning while moving in an arrow direction directed by the target scan line 10.

Hereinafter, an actual scan line 20, the correction scan line 30 and a final scan line 40 other than the target scan line 10 are illustrated in a same manner as the target scan line 10 in FIGS. 4 to 8.

In this case, referring to FIGS. 4 to 6, in order to check the correction scan line 30 of the laser beam, a preparatory process that fixes the preparatory mask sheet 2 onto a separate mask frame 4 (hereinafter, referred to as a "preparatory mask frame") and checks the correction scan line 30 on the preparatory mask sheet 2 is performed similarly to the process of manufacturing an actual mask. In this case, the preparatory mask sheet 2 and the preparatory mask frame 4 may be substantially same as the actual mask sheet 12 and the mask frame 14.

More specifically, referring to FIGS. 2 and 4, in order to check the correction scan line 30 of the laser beam, first, a counter force is applied to the preparatory mask sheet 2 in opposing side directions (e.g., upper and lower side directions) of the preparatory mask sheet 2 in the operation S201 and then the preparatory mask sheet 2 is fixed to the preparatory mask frame 4 in the operation S202. However, the invention is not limited thereto, and the counter force may be applied to at least one of the side directions.

In an exemplary embodiment, in order to fix the preparatory mask sheet 2 to the preparatory mask frame 4, a known fixing method such as point welding may be used.

As described above, in the status when the preparatory mask sheet 2 is fixed to the preparatory mask frame 4, as illustrated in FIG. 4, the laser beam is scanned along the target scan line 10 in the operation S203.

As described above, after scanning the laser beam along the target scan line 10, the counter force which is applied to the preparatory mask sheet 2 is released in the operation S204. Accordingly, as illustrated in FIG. 5, the preparatory mask sheet 2 is compressed and the actual scan line 20 which is shifted from the target scan line 10 is formed.

In this case, the "actual scan line" is defined as a scan line which is actually formed on the preparatory mask sheet 2 after releasing the counter force which is applied to the preparatory mask sheet 2 after the laser beam is scanned along the target scan line 10 in a status when the counter force is applied to the preparatory mask sheet 2, and has an error which is shifted from the target scan line 10.

In the exemplary embodiment illustrated in FIG. 5, the actual scan line 20 may be a line which is slanted from the target scan line 10 at a predetermined angle $\alpha$ in a pattern processing target region 6.

In the exemplary embodiment illustrated in FIG. 5, even though the actual scan line 20 is formed at the left side of the target scan line 10, the invention is not limited thereto, and the actual scan line 20 may be formed at the right side of the target scan line 10. In another exemplary embodiment, the actual scan line 20 may formed at both of the left and right sides of the target scan line 10.

In the exemplary embodiment, in a status when the counter force which is applied to the preparatory mask sheet 2 is released, an error between the target scan line 10 and the actual scan line 20, for example, an angle of the actual scan line 20 which is slanted with respect to the target scan line 10 or a distance between the target scan line 10 and the actual scan line 20 in a direction of the target scan line 10, is checked in the operation S205. The correction scan line 30 of the laser beam is set in the operation S206 using the error checked as described above.

In this case, the correction scan line 30 may be experimentally selected so that the scan line of the laser matches the target scan line 10 in a state when the counter force applied to the preparatory mask sheet 2 is released after scanning the laser along the correction scan line 30 in a status when the counter force applied to the preparatory mask sheet 2 is released.

In an exemplary embodiment, the correction scan line 30 may be substantially symmetrical to the actual scan line 20 with reference to the target scan line 10 with a same distance d between the target scan line 10 and the actual scan line 20 and between the correction scan line 30 and the actual scan line 20 in a direction substantially orthogonal to the target line, as illustrated in FIG. 6.

In this case, an angle α between the target scan line 10 and the correction scan line 30 may be substantially same as an angle α between the target scan line 10 and the actual scan line 20.

As described above, as a preparatory operation, the correction scan line 30 is checked in the operation S101 and then a counter force is applied to the mask sheet 12 in the operation S102 in order to manufacture the actual mask.

In the status when the counter force is applied to the mask sheet 12, the mask sheet 12 is fixed to the mask frame 14 in the operation S103 and, as illustrated in FIG. 7, the laser beam is scanned along the correction scan line 30 in the operation S104.

As described above, in a status when the mask sheet 12 is fixed to the mask frame 14 after scanning the laser beam, the counter force which is applied to the mask sheet 12 is released in the operation S105.

When the above processes are subjected, as illustrated in FIG. 8, the final scan line 40 which is formed in the pattern processing target region 16 on the mask sheet 12 matches the target scan line 10.

As described above, when the laser beam is scanned to perform the pattern processing on the mask sheet 12 so that the final scan line 40 is formed in the same position as a desired target scan line 10 (refer to FIG. 2), a pattern error which may occur during the pattern forming process using the laser beam may be effectively prevented.

According to the exemplary embodiment, after checking the correction scan line by a process that preliminarily provides the preparatory mask sheet on the preparatory mask frame, in an actual mask manufacturing process, the laser beam is scanned on the mask sheet along the correction scan line so that the final scan line of the laser beam after manufacturing the actual mask matches the target scan line, which may effectively prevent the pattern error from occurring on the actual mask sheet.

While this invention has been described in connection with what is presently considered to be practical exemplary embodiments, it is to be understood that the invention is not limited to the disclosed exemplary embodiments, those skilled in the art may suggest another exemplary embodiment by adding, modifying, or deleting component within the spirit and scope of the appended claims and the another exemplary embodiment also falls into the scope of the invention.

What is claimed is:

1. A method of forming a pattern on a mask sheet using a laser beam, the method comprising:
determining a target scan line with respect to the mask sheet, which corresponds to a position of the pattern on a final mask sheet;
determining a correction scan line with respect to the mask sheet, along which the laser beam is scanned to form the pattern of the final mask sheet;
applying a counter force to the mask sheet;
fixing the mask sheet onto a mask frame while the counter force is applied to the mask sheet;
scanning the laser beam along the correction scan line; and
releasing the counter force which is applied to the mask sheet;
the determining the correction scan line of the laser beam includes:
applying a counter force to a preparatory mask sheet;
fixing the preparatory mask sheet to a preparatory mask frame while the counter force is applied to the preparatory mask sheet;
scanning the laser beam along the target scan line;
releasing the counter force which is applied to the preparatory mask sheet;
determining an actual scan line of the laser, in a status when the counter force which is applied to the preparatory mask sheet is released;
determining an error between the target scan line and the actual scan line of the laser beam; and
setting the correction scan line of the laser beam using the error.

2. The method of claim 1, wherein:
in the setting the correction scan line of the laser beam, the correction scan line
is substantially symmetrical to the actual scan line with reference to the target scan line, wherein a distance between the target scan line and the actual scan line, and between the target line and the correction scan line, is substantially the same.

3. The method of claim 1, wherein:
in the setting the correction scan line of the laser beam, an angle between the target scan line and the correction scan line is substantially same as an angle between the target scan line and the actual scan line.

4. The method of claim 1, wherein:
the actual scan line is determined at a right side or a left side of the target scan line.

5. The method of claim 1, wherein:
the counter forces respectively applied to the mask sheet and the preparatory mask sheet are applied in opposing side directions of the mask sheet and the preparatory mask sheet, respectively.

* * * * *